US010170223B2

(12) United States Patent
Choi

(10) Patent No.: US 10,170,223 B2
(45) Date of Patent: Jan. 1, 2019

(54) CHIP RESISTOR AND CHIP RESISTOR ASSEMBLY

(71) Applicant: SAMSUNG ELECTRO-MECHANICS CO., LTD., Suwon-si, Gyeonggi-do (KR)

(72) Inventor: Woo Jin Choi, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/634,305

(22) Filed: Jun. 27, 2017

(65) Prior Publication Data
US 2018/0137957 A1    May 17, 2018

(30) Foreign Application Priority Data

Nov. 15, 2016    (KR) .......................... 10-2016-0152018

(51) Int. Cl.
| H01C 7/00 | (2006.01) |
| H01C 1/142 | (2006.01) |
| H05K 1/18 | (2006.01) |
| H01C 17/00 | (2006.01) |
| H01C 17/245 | (2006.01) |
| H01C 17/28 | (2006.01) |

(52) U.S. Cl.
CPC ............ *H01C 7/003* (2013.01); *H01C 1/142* (2013.01); *H05K 1/181* (2013.01); *H01C 17/006* (2013.01); *H01C 17/245* (2013.01); *H01C 17/281* (2013.01); *H05K 2201/10022* (2013.01)

(58) Field of Classification Search
CPC ...... H01C 7/003; H01C 1/142; H01C 17/006; H01C 17/245; H01C 17/281
USPC ......................................... 338/309, 307, 332
See application file for complete search history.

(56) References Cited

U.S. PATENT DOCUMENTS

| 5,170,146 A * | 12/1992 | Gardner ............... H01C 17/006 338/272 |
| 5,179,366 A * | 1/1993 | Wagner ................. H01C 1/084 338/308 |
| 5,548,269 A * | 8/1996 | Katsuno ................ H01C 1/148 338/195 |
| 6,005,474 A * | 12/1999 | Takeuchi ............... H01C 1/142 29/620 |

(Continued)

FOREIGN PATENT DOCUMENTS

| JP | 2002-343614 A | 11/2002 |
| KR | 10-2006-0106647 A | 10/2006 |

(Continued)

*Primary Examiner* — Kyung S Lee
(74) *Attorney, Agent, or Firm* — McDermott Will & Emery LLP

(57) ABSTRACT

A chip resistor includes a base substrate having first and second surfaces opposing each other. First and second resistor layers are separated from each other and are on the first surface of the base substrate. First and second terminals are on opposing end portions of the base substrate, respectively, and are connected to first sides of the first and second resistor layers, respectively. Third and fourth terminals are between the first and second terminals, and are respectively connected to second sides of the first and second resistor layers that respectively oppose the first sides of the first and second resistor layers.

15 Claims, 7 Drawing Sheets

(56) References Cited

U.S. PATENT DOCUMENTS

| | | | | |
|---|---|---|---|---|
| 7,154,373 | B2* | 12/2006 | Kobayashi | H01C 1/01 338/320 |
| 8,284,016 | B2* | 10/2012 | Ryu | H01C 1/034 338/307 |
| 2006/0220783 | A1 | 10/2006 | Kuriyama | |
| 2009/0085715 | A1* | 4/2009 | Zandman | H01C 1/014 338/275 |
| 2010/0225439 | A1* | 9/2010 | Han | H01C 1/012 338/309 |
| 2012/0126934 | A1* | 5/2012 | Belman | H01C 17/288 338/309 |
| 2016/0099093 | A1* | 4/2016 | Lee | H05K 1/181 174/260 |

FOREIGN PATENT DOCUMENTS

| KR | 10-2010-0095269 A | 8/2010 |
|---|---|---|
| KR | 10-2017-0079027 | 7/2017 |
| KR | 10-2017-0079031 | 7/2017 |
| KR | 10-2017-0081453 | 7/2017 |

\* cited by examiner

CHIP RESISTOR AND CHIP RESISTOR ASSEMBLY

CROSS-REFERENCE TO RELATED APPLICATION

This application claims the benefit of priority to Korean Patent Application No. 10-2016-0152018, filed on Nov. 15, 2016 with the Korean Intellectual Property Office, the entirety of which is incorporated herein by reference.

BACKGROUND

1. Field

The following description relates to a chip resistor and a chip resistor assembly.

2. Description of Related Art

Chip resistors are chip components used to implement a precise degree of resistance, and to adjust a current and drop a voltage within an electronic circuit.

Defects, for example, short circuits, can occur in resistors damaged by external impacts such as surge or static electricity. When such defects occur in a circuit using resistors, all levels of currents generated from a power supply can flow into integrated circuits (ICs), which results in serious secondary damage to the IC. In order to prevent such a phenomenon, a plurality of resistors can be used in the circuit. However, such design inevitably increases the space occupied by the resistors on the substrates.

In portable electronic apparatuses, which have been gradually minimized and which operate with a high precision, it is not desirable to increase the amount of space occupied by resistors used for the purpose of circuit stability. Thus, research into chip resistors that are able to adjust a current more effectively is required.

SUMMARY

This Summary is provided to introduce a selection of concepts in a simplified form that are further described below in the Detailed Description. This Summary is not intended to be limiting with respect to key or essential features of the claimed subject matter, nor is it intended to solely govern any determination of the scope of the claimed subject matter.

An aspect of the present disclosure may provide a chip resistor and a chip resistor assembly that may improve a degree of circuit integration.

According to an aspect of the present disclosure, a chip resistor may include a base substrate having first and second surfaces opposing each other. First and second resistor layers are separated from each other and are on the first surface of the base substrate. First and second terminals are on opposing end portions of the base substrate, respectively, and are connected to first sides of the first and second resistor layers, respectively. Third and fourth terminals are between the first and second terminals, and are respectively connected to second sides of the first and second resistor layers that respectively oppose the first sides of the first and second resistor layers.

According to an aspect of the present disclosure, a chip resistor assembly may include a circuit board having a plurality of electrode pads. A chip resistor is on the circuit board, and is connected to the plurality of electrode pads. The chip resistor includes first and second resistor layers that are separated from each other and are on a first surface of a base substrate. First and second terminals are on opposing end portions of the base substrate, and are connected to first sides of the first and second resistor layers, respectively. Third and fourth terminals are between the first and second terminals, and are respectively connected to second sides of the first and second resistor layers that respectively oppose the first sides of the first and second resistor layers.

DETAILED DESCRIPTION

Figure 1:
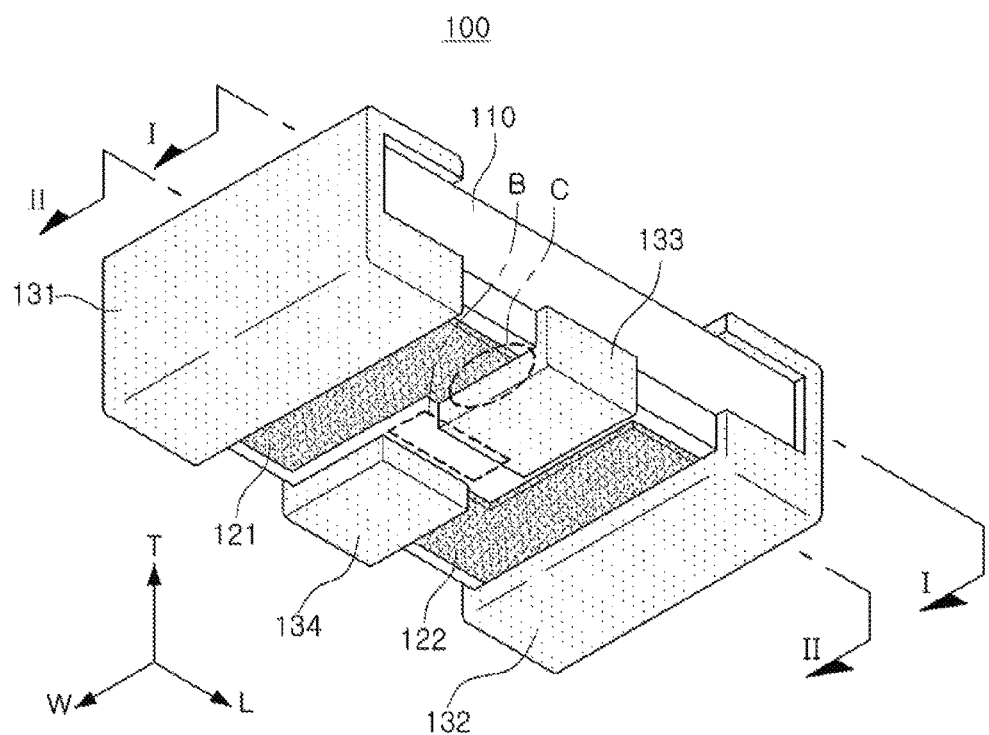
FIG. 1 is a perspective view illustrating a chip resistor according to an exemplary embodiment.

Hereinafter, reference will now be made in detail to examples with reference to the accompanying drawings, wherein like reference numerals refer to like elements throughout.

Throughout the specification, it will be understood that when an element, such as a layer, region or wafer (substrate), is referred to as being "on," "connected to," or "coupled to" another element, it can be directly "on," "connected to," or "coupled to" the other element, or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated, listed items.

It will be apparent that, although the terms 'first,' 'second,' 'third,' etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship relative to another element(s), as shown in the figures. It will be understood that spatially relative terms are intended to encompass different orientations of the device in use or operation, in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations, depending on a particular directional orientation of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted alone or as a combination of several or all thereof.

The contents of the present disclosure described below may have a variety of configurations, and a configuration is proposed herein, but the present disclosure is not limited thereto.

FIG. 1 is a perspective view illustrating a chip resistor 100 according to an embodiment. Referring to FIG. 1, the chip resistor 100 may include a base substrate 110, a first resistor layer 121, a second resistor layer 122, and first to fourth terminals 131 to 134.

The base substrate 110 may support the first and second resistor layers 121 and 122 and secure strength of the chip resistor 100. The base substrate 110 may have a predetermined thickness and have a thin plate shape that includes one rectangular surface, but is not limited thereto.

The base substrate 110 may be formed of a material having excellent thermal conductivity, and may externally emit heat generated in the first and second resistor layers 121 and 122 when the chip resistor is in use. For example, the base substrate 110 may be formed of a ceramic material such as alumina ($Al_2O_3$) or a polymer material. In a particular example, the base substrate 110 may be an alumina substrate obtained by anodizing a surface of aluminum having a thin plate shape.

The first and second resistor layers 121 and 122 may be disposed on one surface of the base substrate 110. The first resistor layer 121 may be disposed between the first and third terminals 131 and 133, and the second resistor layer 122 may be disposed between the second and fourth terminals 132 and 134. In this arrangement, opposing sides of the first resistor layer 121 may be connected to the first and third terminals 131 and 133, respectively, for use as resistor elements, and opposing sides of the second resistor layer 122 may be connected to the second and fourth terminals 132 and 134, respectively, for use as resistor elements. The resistance between the first and third terminals 131 and 133 may be different from the resistance between the second and fourth terminals 132 and 134.

The first to fourth terminals 131 to 134 may be separated from each other on one surface of the base substrate 110. The first and second terminals 131 and 132 may be disposed on opposing end portions of the base substrate 110, respectively, and the third and fourth terminals 133 and 134 may be disposed between the first and second terminals 131 and 132.

As illustrated in FIG. 1, the third and fourth terminals 133 and 134 may face each other between the first and second terminals 131 and 132. The third and fourth terminals 133 and 134 may be the same distance from a first surface of the base substrate 110. This arrangement may allow the chip resistor 100 to be mounted on a circuit board such that the third and fourth terminals 133 and 134 may be connected to the same electrode pad of a circuit board. Thus, if the third and fourth terminals 133 and 134 are mounted on the circuit board so as to not be connected to the same electrode pad, the arrangement of the third and fourth terminals 133 and 134 may be changed.

The first terminal 131 may be connected to one side of the first resistor layer 121, and the second terminal 132 may be connected to one side of the second resistor layer 122. The third terminal 133 may be connected to the opposing side of the first resistor layer 121, and the fourth terminal 134 may be connected to the opposing side of the second resistor layer 122. The first resistor layer 121 may extend from the first terminal 131, and may include a portion C that protrudes to connect to the third terminal 133. The second resistor layer 122 may extend from the second terminal 132, and may include a portion that protrudes to connect to the fourth terminal 134.

The first and second resistor layers 121 and 122 may be formed using various metals or alloys, or a compound such as an oxide. The first and second resistor layers 121 and 122 may include at least one of a Cu—Ni-based alloy, a Ni—Cr-based alloy, a Ru oxide, a Si oxide, Mn, and a Mn-based alloy, for example, or may be formed of different materials.

The resistance values of the first and second resistor layers 121 and 122 may be set by a trimming process. The trimming process may be a process of partial removal of a resistor layer through fine cutting, or the like, of the resistor layer in order to obtain a resistance value required for a circuit design after the resistor layer is formed.

A protective layer (not illustrated) may be disposed on surfaces of the first and second resistor layers 121 and 122. The protective layer may be disposed between the first and second terminals 131 and 132, and may be disposed on a surface B between the third and fourth terminals 133 and 134. The protective layer may prevent the first and second resistor layers 121 and 122 from being externally exposed, and may protect the first and second resistor layers 121 and 122 from external impacts. The protective layer may forma boundary such that the third and fourth terminals 133 and 134 may be insulated from each other. The protective layer will be described in more detail with reference to FIG. 3.

Figure 2:
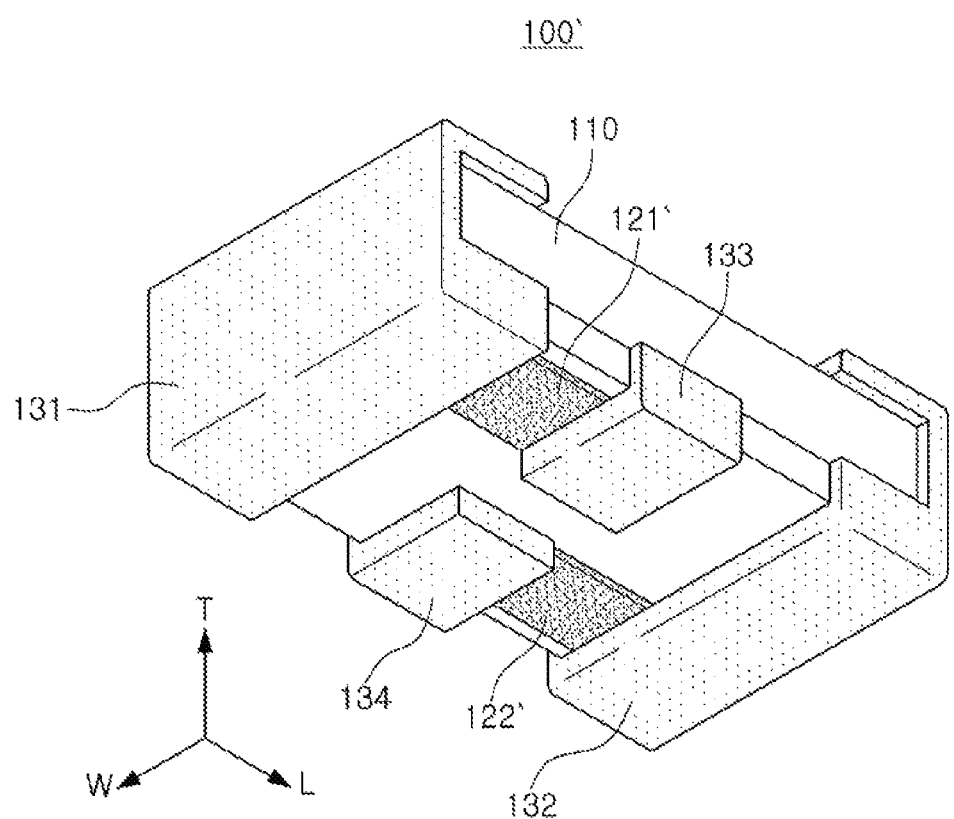
FIG. 2 is a perspective view illustrating a chip resistor according to an exemplary embodiment.

FIG. 2 is a perspective view illustrating a chip resistor 100' according to an exemplary embodiment. In comparison to the chip resistor 100 illustrated in FIG. 1, a first resistor layer 121' and a second resistor layer 122' of the chip resistor 100' illustrated in FIG. 2 may be arranged to have a rectangular shape, with a constant width. The first resistor layer 121' may have various forms, may extend between first and third terminals 131 and 133 to be connected to the first and third terminals 131 and 133, for example, but is not limited thereto. The second resistor layer 122' may have various forms, and may extend between second and fourth terminals 132 and 134 to be connected to the second and fourth terminals 132 and 134, for example.

Figure 3:
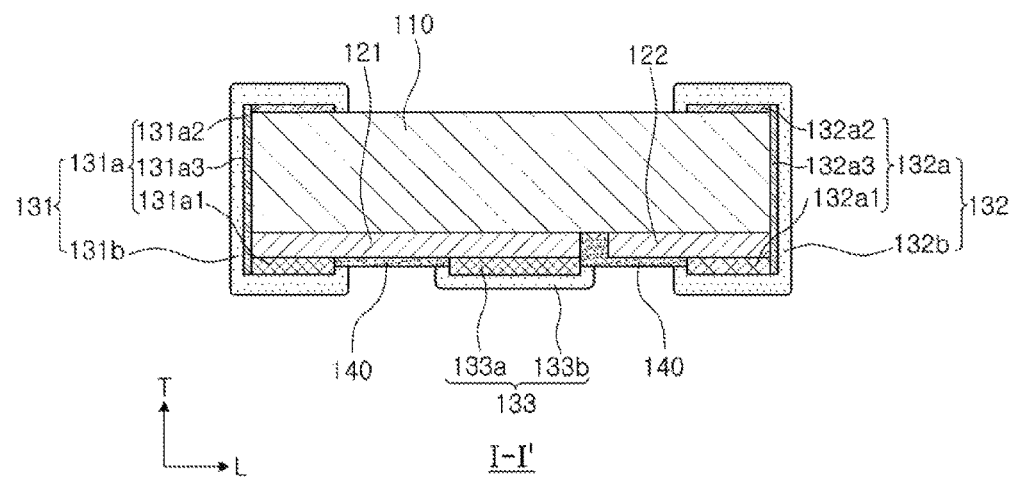
FIG. 3 is a cross-sectional view of the chip resistor of FIG. 1 taken along line I-I'.

FIG. 3 is a cross-sectional view of the chip resistor 100 of FIG. 1 taken along line I-I'. Referring to FIG. 3, the chip resistor 100 may include the base substrate 110, the first resistor layer 121, the second resistor layer 122, and the first to third terminals 131 to 133.

Figure 4:
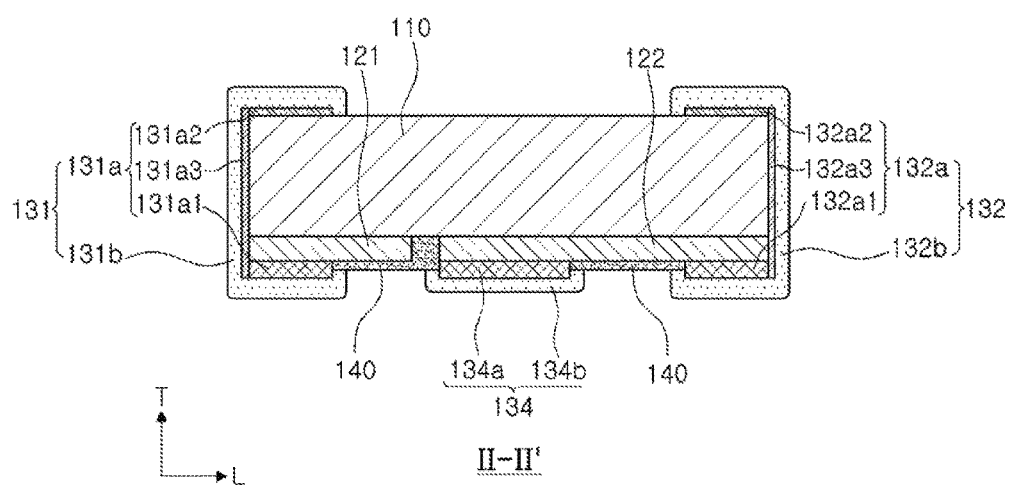
FIG. 4 is a cross-sectional view of the chip resistor of FIG. 1 taken along line II-II'.

The chip resistor 100 may further include the fourth terminal 134. However, the fourth terminal 134 is not illustrated in FIG. 3, but is illustrated in FIG. 4. FIG. 4 is a cross-sectional view of the chip resistor 100 of FIG. 1 taken along line II-II'. FIG. 4 shows the fourth terminal 134 connected to the second resistor layer 122.

Referring to FIGS. 3 and 4, the first and second resistor layers 121 and 122 may be disposed on the first surface of the base substrate 110. The first terminal 131 may be connected to the first resistor layer 121 such that the first terminal 131 may surround one side of the first resistor layer 121 on one end portion of the base substrate 110, and the second terminal 132 may be connected to the second resistor layer 122 such that the second terminal 132 may surround one side of the second resistor layer 122 on the opposing end portion of the base substrate 110. The third terminal 133 may be connected to the other side of the first resistor layer 121, and the fourth terminal 134 may be connected to the other side of the second resistor layer 122.

An exemplary embodiment of the first to fourth terminals 131 to 134 will hereinafter be described in detail.

The first terminal 131 may include a first internal electrode 131*a* and a first external electrode 131*b*. The second terminal 132 may include a second internal electrode 132*a* and a second external electrode 132*b*. The third terminal 133 may include a third internal electrode 133*a* and a third external electrode 133*b*. The fourth terminal 134 may include a fourth internal electrode 134*a* and a fourth external electrode 134*b*.

The first and second internal electrodes 131*a* and 132*a* may be disposed on opposing end portions of the base substrate 110, respectively. The third internal electrode 133*a* may be disposed on the first resistor layer 121 between the first and second terminals 131 and 132. The fourth internal electrode 134*a* may be disposed on the second resistor layer 122 between the first and second terminals 131 and 132.

The first to fourth external electrodes 131*b* to 134*b* may be disposed on the first to fourth internal electrodes 131*a* to 134*a*, respectively. The first to fourth external electrodes 131*b* to 134*b* may cover at least regions of surfaces of the first to fourth internal electrodes 131*a* to 134*a*, respectively.

The first internal electrode 131*a* may include a first seed electrode 131*a*1 and a first rear electrode 131*a*2. The second internal electrode 132*a* may include a second seed electrode 132*a*1 and a second rear electrode 132*a*2.

The first and second seed electrodes 131*a*1 and 132*a*1 may be disposed on the first and second resistor layers 121 and 122, respectively. The first and second rear electrodes 131*a*2 and 132*a*2 may be disposed on the second surface opposing the first surface of the base substrate 110. In an exemplary embodiment, the first seed electrode 131*a*1 may face the first rear electrode 131*a*2, and the second seed electrode 132*a*1 may face the second rear electrode 132*a*2.

The first internal electrode 131*a* may further include a first side electrode 131*a*3, and the second internal electrode 132*a* may further include a second side electrode 132*a*3.

The first and second side electrodes 131*a*3 and 132*a*3 may be disposed on opposing end surfaces of a laminate, respectively, formed by disposing the base substrate 110, the first resistor layer 121, the second resistor layer 122, the first and second seed electrodes 131*a*1 and 132*a*1, and the first and second rear electrodes 131*a*2 and 132*a*2.

The first side electrode 131*a*3 may be connected to the first seed electrode 131*a*1 and the first rear electrode 131*a*2, and the second side electrode 132*a*3 may be connected to the second seed electrode 132*a*1 and the second rear electrode 132*a*2. When the first internal electrode 131*a* includes the first side electrode 131*a*3 and the second internal electrode 132*a* includes the second side electrode 132*a*3, the first and second external electrodes 131*b* and 132*b* may also be formed on the first and second side electrodes 131*a*3 and 132*a*3, respectively.

The first to fourth internal electrodes 131*a* to 134*a* may be formed using a printing process (a process of printing and then firing a conductive paste) or a deposition process using a conductive paste. The first to fourth internal electrodes 131*a* to 134*a* may act as seeds in a plating process for the first to fourth external electrodes 131*b* to 134*b*. The internal electrode may include at least one of silver (Ag), copper (Cu), nickel (Ni), and platinum (Pt), for example.

The first to fourth external electrodes 131*b* to 134*b* may be formed on the first to fourth internal electrodes 131*a* to 134*a*, respectively, by a plating process. The first to third external electrodes 131*b* to 133*b* may be formed after a protective layer 140 is formed.

The first to fourth external electrodes 131*b* to 134*b* may include at least one of nickel (Ni), tin (Sn), copper (Cu), and chromium (Cr). For example, the first to fourth external electrodes 131*b* to 134*b* may include a double layer of a Ni plating layer and a Sn plating layer, and may further include a Cu plating layer. The Ni plating layer may prevent a component of the internal electrode (for example, Ag) from leaching into a solder component when mounting the chip resistor. The Sn plating layer may be provided to be easily bonded to the solder component at the time of mounting the chip resistor. The Cu plating layer may improve conductivity of the internal electrode.

The protective layer 140 may include silicon ($SiO_2$), glass, or a polymer.

The protective layer 140 may include a first protective layer formed of glass and a second protective layer formed of a polymer. The first protective layer may be formed before the trimming process, to prevent the first and second resistor layers 121 and 122 from cracking during the trimming process, with the second protective layer formed after the trimming process, to protect the first and second resistor layers 121 and 122.

Figure 5:
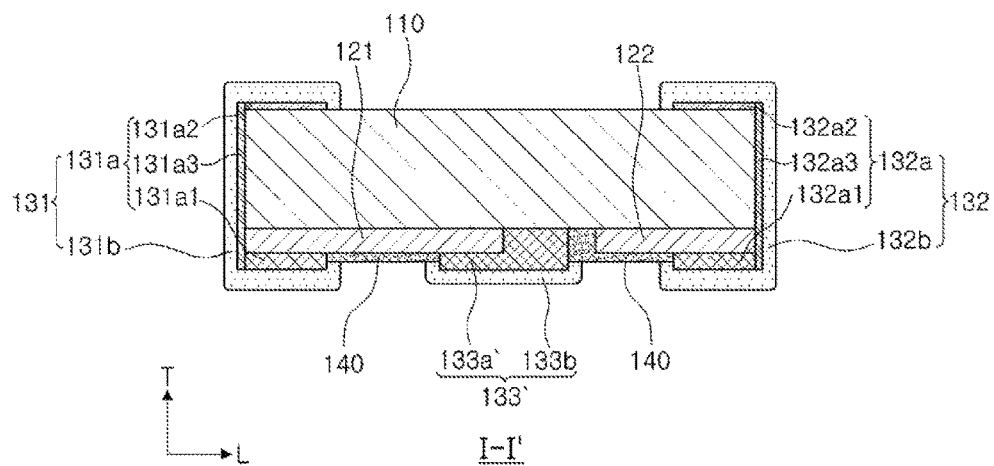
FIG. 5 is a cross-sectional view illustrating a chip resistor according to an exemplary embodiment.

FIG. 5 is a cross-sectional view illustrating a chip resistor according to an exemplary embodiment. In comparison to the chip resistor 100 illustrated in FIG. 3, a third terminal 133' of the chip resistor illustrated in FIG. 5 may be formed such that a third internal electrode 133*a'* of the third terminal 133' may cover one side of a first resistor layer 121. This may significantly increase the contact area between the third internal electrode 133*a'* and the first resistor layer 121. Similarly, a first internal electrode 131*a* may cover the other side of the first resistor layer 121, a second internal electrode 132*a* may cover one side of a second resistor layer 122, and the fourth internal electrode 134*a* (FIG. 4) may cover the other side of the second resistor layer 122. As described above, the first to fourth terminals 131 to 134 may have various forms.

Figure 6:
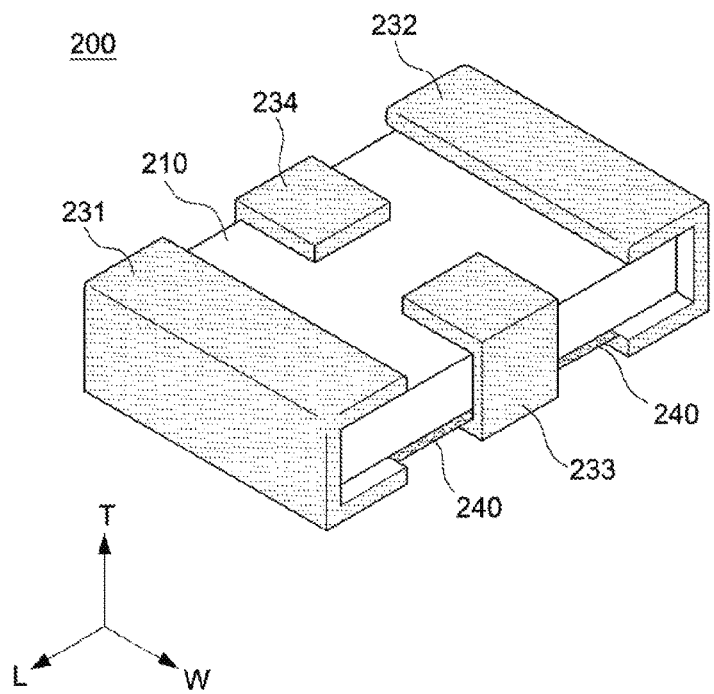
FIG. 6 is a perspective view illustrating a chip resistor according to an exemplary embodiment.

FIG. 6 is a perspective view illustrating a chip resistor 200 according to an exemplary embodiment. Referring to FIG. 6, the resistor element 200 may include a base substrate 210, first to fourth terminals 231 to 234, and a protective layer 240. In comparison to the chip resistor 100 illustrated in FIG. 1, the chip resistor 200 of FIG. 6 may have a third terminal 233 that extends to the second surface of the base substrate 210 along a first side surface positioned between a first surface and the second surface of the base substrate 210, and may have a fourth terminal 234 that extends to the second surface along a second side surface opposing the first side surface.

Detailed exemplary embodiments of the first resistor layer, the second resistor layer, and the first to fourth terminals 231 to 234 can be understood from the foregoing exemplary embodiments, and overlapping descriptions of the same or similar components are thus omitted.

Figure 7:
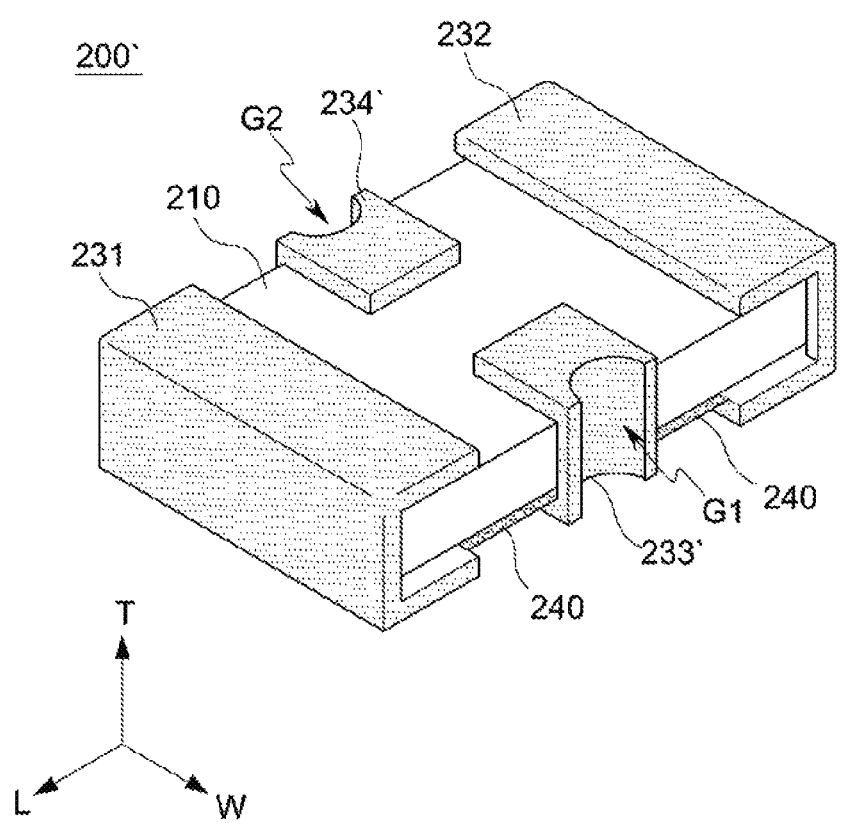
FIG. 7 is a perspective view illustrating a chip resistor according to an exemplary embodiment.

FIG. 7 is a perspective view illustrating a chip resistor 200' according to an exemplary embodiment. The resistor element 200' may include a base substrate 210, first to fourth terminals 231, 232, 233', and 234', and a protective layer 240. In comparison to the chip resistor 200 illustrated in FIG. 6, a first groove G1 and a second groove G2 may respectively be formed in first and second side surfaces of the base substrate 210 of the chip resistor 200' illustrated in FIG. 7. The third terminal 233' may extend along the first groove G1 formed in the first side surface, and the fourth terminal 234' may extend along the second groove G2 formed in the second side surface. Thus, portions of extended portions of the third and fourth terminals 233' and 234' may be formed on the first and second side surfaces, and may have a concave shape corresponding to a surface shape of the first and second grooves G1 and G2. These shapes of the third and fourth terminals 233' and 234' may prevent a defect such as solder spread, which may occur when mounting the chip resistor 200'.

Detailed exemplary embodiments of the first resistor layer, the second resistor layer, and the first to fourth terminals 231, 232, 233', and 234' can be understood from the foregoing exemplary embodiments, and overlapping descriptions of the same or similar components are thus omitted.

Figure 8:
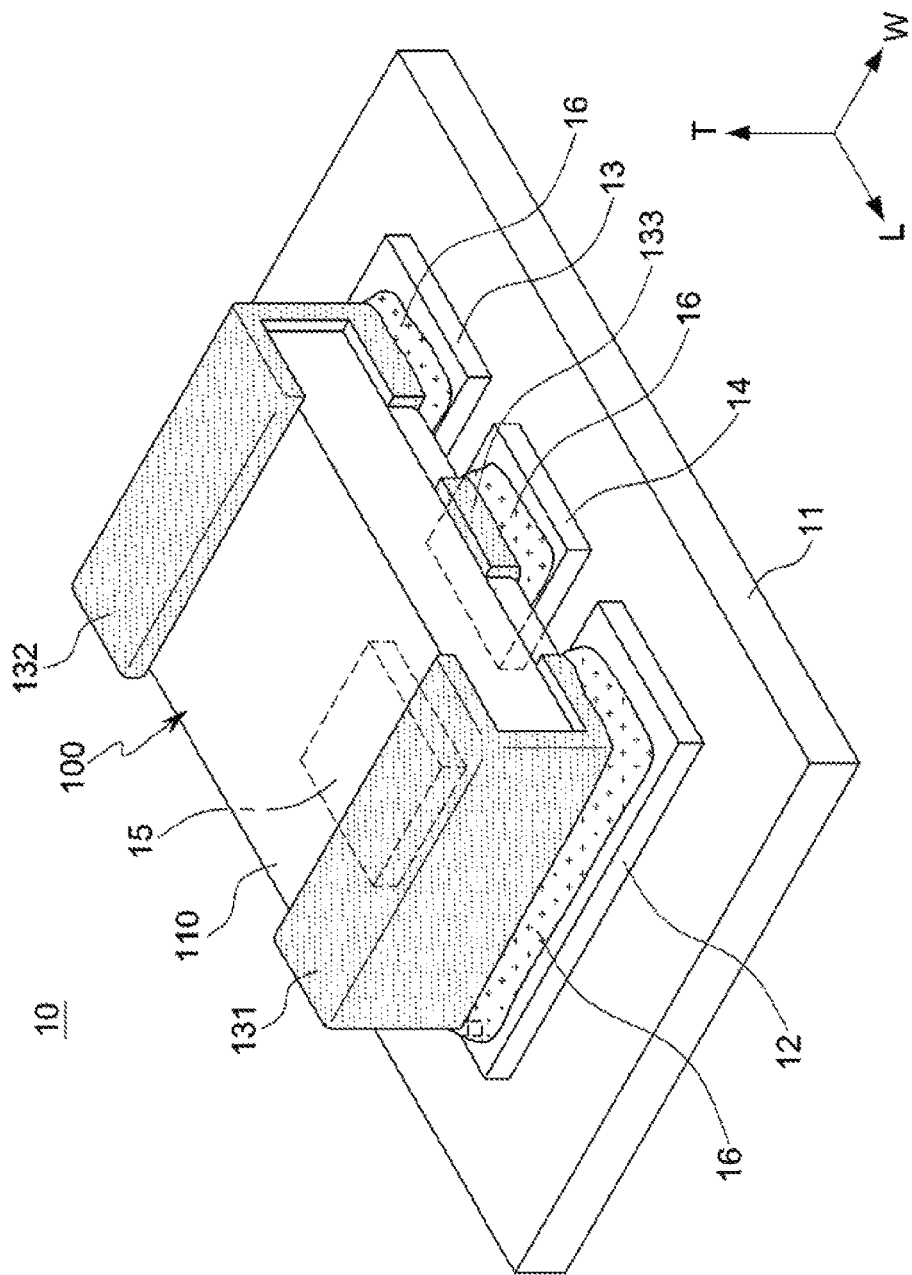
FIG. 8 is a perspective view illustrating an exemplary embodiment of a chip resistor assembly with the chip resistor illustrated in FIG. 1 mounted on a substrate.

FIG. 8 is a perspective view illustrating an exemplary embodiment of a chip resistor assembly 10 with the chip resistor 100 illustrated in FIG. 1 mounted on a substrate.

Referring to FIG. 8, the chip resistor assembly 10 may include the chip resistor 100 illustrated in FIG. 1 and a circuit board 11 on which the chip resistor 100 is mounted.

The circuit board 11 may include first to fourth electrode pads 12 to 15 disposed in a mounting region of the chip resistor. The first to fourth electrode pads 12 to 15 may refer to land patterns connected to a circuit pattern implemented on the circuit board 11, and provided in order to mount the chip resistor.

The chip resistor 100 may include the base substrate 110. The first and second resistor layers 121 and 122 may be separated from each other on the first surface of the base substrate 110. The first and second terminals 131 and 132 may be on the opposing end portions of the base substrate 110, respectively, and may be connected to first sides of the first and second resistor layers 121 and 122, respectively. The third and fourth terminals 133 and 134 may be between the first and second terminals 131 and 132, and may be respectively connected to second sides of the first and second resistor layers 121 and 122 that respectively oppose the first sides of the first and second resistor layers.

The chip resistor 100 can be understood from the chip resistor described in relation to FIGS. 1 through 5, and overlapping descriptions of the same or similar components are thus omitted.

The circuit board 11 may have an electronic circuit formed thereon, while an integrated circuit (IC) for a specific operation or control of an electronic apparatus, or the like, may be formed on the circuit board 11, such that a current supplied by a separate power supply may flow to the circuit board 11.

The circuit board 11 may include various wiring lines or further include other types of semiconductor elements such as a transistor, and the like. The circuit board 11 may be variously configured. For example, the circuit board 11 may include a conductive layer or a dielectric layer.

The first to fourth electrode pads 12 to 15 may be spaced apart from each other on the circuit board 11, and may be connected to the first to fourth terminals 131 to 134, respectively, of the chip resistor 100, by solder 16.

The first and second electrode pads 12 and 13 may be connected to signal wirings, and a pull-up voltage or a pull-down voltage may be applied to the third and fourth electrode pads 14 and 15. When a pull-up voltage is applied to the third electrode pad 14 and a pull-down voltage is applied to the fourth electrode pad 15, the chip resistor 100 may function as a pull-up resistor with respect to the signal wiring connected to the first electrode pad 12 and, independently of this function, may serve as a pull-down resistor with respect to the signal wiring connected to the second electrode pad 13.

Figure 9:
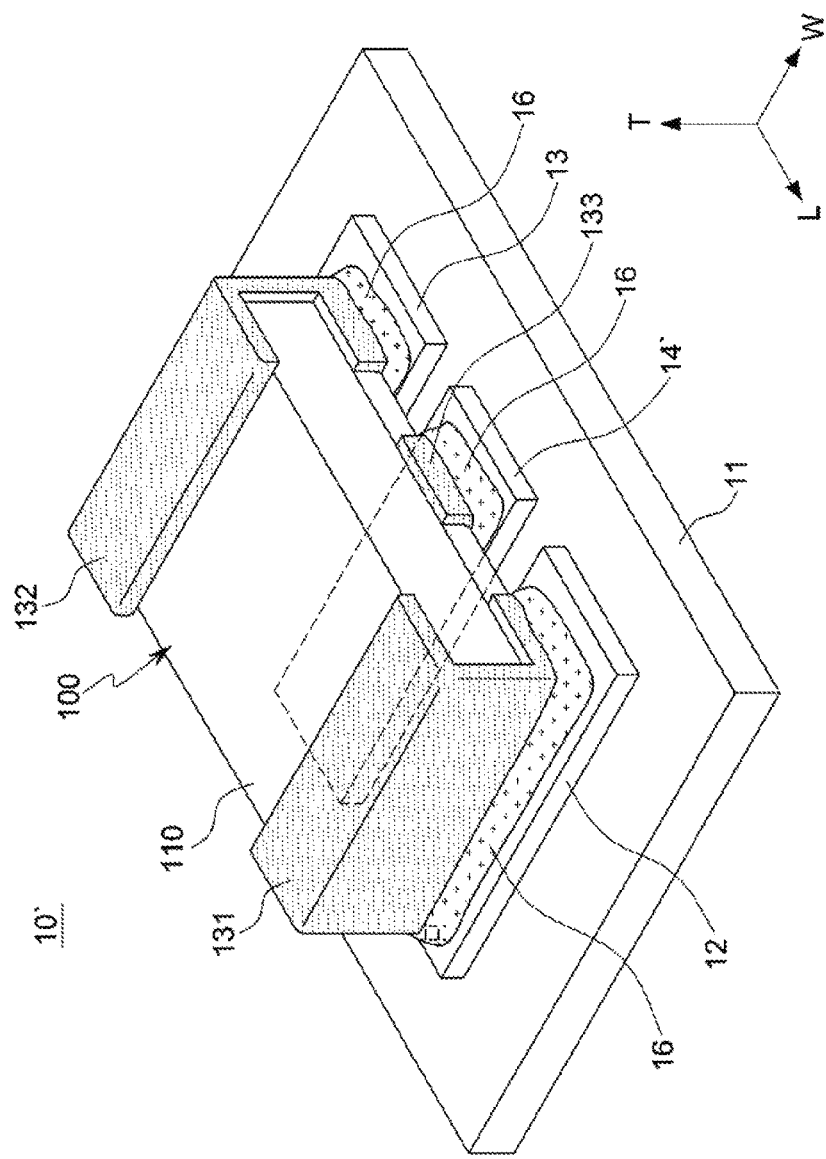
FIG. 9 is a perspective view illustrating an exemplary embodiment of a chip resistor assembly with the chip resistor illustrated in FIG. 1 mounted on a substrate.

As illustrated in FIG. 9, a third electrode pad 14' may be designed to be connected to both the third and fourth terminals 133 and 134 of the chip resistor 100. When a pull-up voltage is applied to the third electrode pad 14', the chip resistor 100 may operate as a pull-up resistor with respect to signal wirings connected to first and second electrode pads 12 and 13.

The chip resistor assembly according to the exemplary embodiments may thus provide a circuit performing various functions, using the same chip resistor, thus improving a degree of circuit integration.

As set forth above, according to an exemplary embodiment, a chip resistor and a chip resistor assembly may include two center terminals positioned between other terminals, and may apply different levels of voltages to the two center terminals, thus improving a degree of circuit integration.

While exemplary embodiments have been shown and described above, it will be apparent to those skilled in the art that modifications and variations could be made without departing from the scope of the present invention, as defined by the appended claims.

What is claimed is:

1. A chip resistor comprising:
   a base substrate having first and second surfaces opposing each other;
   first and second resistor layers separated from each other and disposed on the first surface of the base substrate;
   first and second terminals disposed respectively on end portions of the base substrate opposite each other in a longitudinal direction, and connected respectively to first sides of the first and second resistor layers; and
   third and fourth terminals disposed between the first and second terminals, and respectively connected to second sides of the first and second resistor layers that respectively oppose the first sides of the first and second resistor layers,
   wherein the third and the fourth terminals face each other in a width direction of the base substrate, the width direction being perpendicular to the longitudinal direction.

2. The chip resistor of claim 1, wherein the first resistor layer extends from the first terminal and includes a portion that protrudes to connect to the third terminal, and the second resistor layer extends from the second terminal and includes a portion that protrudes to connect to the fourth terminal.

3. The chip resistor of claim 1, wherein the third terminal covers the second side of the first resistor layer, and the fourth terminal covers the second side of the second resistor layer.

4. The chip resistor of claim 1, wherein a first resistance value between the first and third terminals is different from a second resistance value between the second and fourth terminals.

5. The chip resistor of claim 1, further comprising: a protective layer on surfaces of the first and second resistor layers, and between the third and fourth terminals.

6. The chip resistor of claim 1, wherein the first to fourth terminals include first to fourth internal electrodes disposed on the base substrate, respectively, and include first to fourth external electrodes disposed on the first to fourth internal electrodes, respectively.

7. The chip resistor of claim 1, wherein the third terminal extends to the second surface along a first side surface positioned between the first and second surfaces of the base substrate, and the fourth terminal extends to the second surface along a second side surface opposing the first side surface.

8. The chip resistor of claim 7, wherein the third terminal extends along a first groove in the first side surface, and the fourth terminal extends along a second groove in the second side surface.

9. A chip resistor assembly comprising:
a circuit board having a plurality of electrode pads; and
a chip resistor on the circuit board, and connected to the plurality of electrode pads,
wherein the chip resistor comprises:
first and second resistor layers separated from each other and on a first surface of a base substrate;
first and second terminals disposed respectively on end portions of the base substrate opposite each other in a longitudinal direction, and connected respectively to first sides of the first and second resistor layers; and
third and fourth terminals disposed between the first and second terminals, and respectively connected to second sides of the first and second resistor layers that respectively oppose the first sides of the first and second resistor layers,
wherein the third and the fourth terminals face each other in a width direction of the base substrate, the width direction being perpendicular to the longitudinal direction.

10. The chip resistor assembly of claim 9, wherein the plurality of electrode pads comprise first to fourth electrode pads connected to the first to fourth terminals, respectively.

11. The chip resistor assembly of claim 9, wherein the plurality of electrode pads comprise:
first and second electrode pads connected to the first and second terminals, respectively; and
a third electrode pad connected to the third and fourth terminals.

12. A chip resistor comprising:
a base substrate with upper and lower surfaces opposing each other in a thickness direction, first and second end surfaces opposing each other in a length direction, and first and second side surfaces opposing each other in a width direction;
a first resistor layer on the lower surface of the base substrate;
a second resistor layer on the lower surface of the base substrate and spaced apart from the first resistor layer;
a first terminal on the first end surface and the upper surface of the base substrate, and on a lower surface of the first resistor layer in the thickness direction;
a second terminal on the second end surface and the upper surface of the base substrate, on a lower surface of the second resistor layer in the thickness direction, and spaced apart from the first terminal;
a third terminal on the lower surface of the first resistor layer and spaced apart from the first and second terminals;
a fourth terminal on the lower surface of the second resistor layer and spaced apart from the first, second, and third terminals.

13. The chip resistor of claim 12, wherein:
the third terminal includes a portion on a side surface of the first resistor layer in the length direction, and
the fourth terminal includes a portion on a side surface of the second resistor layer in the length direction.

14. The chip resistor of claim 12, wherein:
the first and second side surfaces of the base substrate each include a groove portion,
the third terminal is on the upper surface of the base substrate and on the groove portion of the first side surface of the base substrate, and
the fourth terminal is on the upper surface of the base substrate and on the groove portion of the second side surface of the base substrate.

15. A chip resistor assembly, comprising:
a circuit board;
first, second, and third electrode pads on a surface of the circuit board; and
the chip resistor of claim 12, wherein the first terminal is connected to the first electrode pad, the second terminal is connected to the second electrode pad, and one or both of the third and fourth terminals are connected to the third electrode pad.

* * * * *